(12) United States Patent
Hsu et al.

(10) Patent No.: US 10,701,822 B2
(45) Date of Patent: Jun. 30, 2020

(54) ELECTRONIC DEVICE AND SLIDE POSITIONING MECHANISM THEREOF

(71) Applicant: FOSITEK CORPORATION, New Taipei (TW)

(72) Inventors: An-Szu Hsu, New Taipei (TW); Way-Han Dai, New Taipei (TW); Chun-Han Lin, New Taipei (TW)

(73) Assignee: FOSITEK CORPORATION, New Taipei (TW)

( * ) Notice: Subject to any disclaimer, the term of this patent is extended or adjusted under 35 U.S.C. 154(b) by 0 days.

(21) Appl. No.: 16/228,373

(22) Filed: Dec. 20, 2018

(65) Prior Publication Data

US 2020/0090846 A1 Mar. 19, 2020

(30) Foreign Application Priority Data

Sep. 13, 2018 (TW) ............................. 107132178 A (51) Int. Cl.
*H05K 5/02* (2006.01)
*H05K 5/00* (2006.01)
(Continued)

(52) U.S. Cl.
CPC ......... *H05K 5/0217* (2013.01); *H05K 5/0017* (2013.01); *H05K 5/03* (2013.01);
(Continued)

(58) Field of Classification Search
CPC ...... H01F 7/02; H05K 5/0017; H05K 5/0217; H05K 5/03
See application file for complete search history.

(56) References Cited

U.S. PATENT DOCUMENTS 7,385,150 B1 * 6/2008 Siddiqui ............. H04M 1/0237
200/5 A
7,672,699 B2 * 3/2010 Kim ..................... H04B 1/3833
455/575.4
(Continued)

FOREIGN PATENT DOCUMENTS

TW 200928138 A 7/2009
TW 201504788 A 2/2015
TW 201516618 A 5/2015

OTHER PUBLICATIONS

Search Report appended to an Office Action, which was issued to Taiwanese counterpart application No. 107132178 by the TIPO dated Jul. 8, 2019, with an English translation thereof.

*Primary Examiner* — Daniel P Wicklund
*Assistant Examiner* — Christopher L Augustin
(74) *Attorney, Agent, or Firm* — Womble Bond Dickinson (US) LLP (57) ABSTRACT

An electronic device includes a base cover, a cover plate which is slidable relative to the base cover among a closed position, an open position, and a transition position, and a slide positioning mechanism which is configured for positioning the cover plate relative to the base cover, and which has first and second magnetically attractive units. When the cover plate is in a selected one of the closed and open positions, a magnetically attractive force is generated to position the cover plate in the selected one of the closed and open positions. When the cover plate is in the transition position, a magnetically repulsive force is generated to facilitate movement of the cover plate away from the transition position.

11 Claims, 11 Drawing Sheets

(51) Int. Cl.
*H05K 5/03* (2006.01)
*H01F 7/02* (2006.01)
*H04B 1/3827* (2015.01)
*H05K 9/00* (2006.01)

(52) U.S. Cl.
CPC .............. *H01F 7/02* (2013.01); *H04B 1/3827* (2013.01); *H05K 9/0075* (2013.01)

(56) References Cited

U.S. PATENT DOCUMENTS

| | | | | |
|---|---|---|---|---|
| 7,760,510 B2* | 7/2010 | Tsai | ...................... | G06F 1/1624 |
| | | | | 361/679.08 |
| 7,885,695 B2* | 2/2011 | Kauhaniemi | ....... | H04M 1/0237 |
| | | | | 361/727 |
| 7,991,444 B2* | 8/2011 | Wang | .................. | H04M 1/0237 |
| | | | | 379/433.11 |
| 2005/0079902 A1* | 4/2005 | Chen | ................... | H04M 1/0237 |
| | | | | 455/575.4 |
| 2008/0174392 A1* | 7/2008 | Cho | .................... | H04M 1/0237 |
| | | | | 335/285 |
| 2008/0307607 A1* | 12/2008 | Kim | .................... | H04M 1/0237 |
| | | | | 16/330 |
| 2011/0077053 A1* | 3/2011 | Lee | ..................... | H04M 1/0237 |
| | | | | 455/566 |
| 2011/0159934 A1* | 6/2011 | Yu | ......................... | G06F 1/1622 |
| | | | | 455/575.4 |
| 2011/0286162 A1* | 11/2011 | Kitamura | ............ | H04M 1/0237 |
| | | | | 361/679.01 |
| 2015/0024809 A1* | 1/2015 | Huang | ................. | H04M 1/0237 |
| | | | | 455/575.4 |
| 2019/0132971 A1* | 5/2019 | Zeng | ........................ | H01F 7/06 |

* cited by examiner

ELECTRONIC DEVICE AND SLIDE POSITIONING MECHANISM THEREOF

CROSS-REFERENCE TO RELATED APPLICATION

This application claims priority from Taiwanese invention patent application no. 107132178, filed on Sep. 13, 2018.

FIELD

The disclosure relates to an electronic device, more particularly to a portable communication device and a slide positioning mechanism thereof.

BACKGROUND

U.S. Pat. No. 9,432,490 B2 discloses a portable electronic device including a first housing, and a second housing slidably coupled to the first housing. The first housing and the second housing is movable between a closed position, an open position and a transition position between the open position and the closed position. At least one input device and at least one position sensor are operable to detect whether the portable electronic device is in the open position, the closed position or the transition position. When the at least one position sensor detects the transition position, the at least one input device is disabled.

SUMMARY

An object of the disclosure is to provide a novel electronic device including a base cover, a cover plate which is slidable relative to the base cover, and a slide positioning mechanism between the base cover and the cover plate. With the provision of the sliding position mechanism, the electronic device may have a relatively small thickness.

According to a first aspect of the disclosure, an electronic device includes a base cover with a concealed area, a cover plate, and a slide positioning mechanism. The cover plate has a front marginal region and is slidable relative to the base cover in a longitudinal direction among a closed position, where the front marginal region covers the concealed area, an open position, where the front marginal region exposes the concealed area, and a transition position between the closed and open positions. The slide positioning mechanism is disposed between the base cover and the cover plate to permit the cover plate to be slidably positioned relative to the base cover in a selected one of the closed and open positions. The slide positioning mechanism includes a base frame mounted on the base cover, a guided frame, and at least one positioning assembly. The guided frame is mounted beneath the cover plate to slide therewith, and is configured to be slidably guided by the base frame so as to permit the cover plate to be guided to slide relative to the base cover. The positioning assembly includes a first magnetically attractive unit and a second magnetically attractive unit. The first magnetically attractive unit is mounted on and outboard of the base frame, and has a plurality of first magnetically attractive members arranged in tandem in the longitudinal direction. The second magnetically attractive unit is mounted beneath the cover plate to slide therewith, and has a plurality of second magnetically attractive members arranged in tandem in the longitudinal direction. The first and second magnetically attractive members respectively have north poles and south poles oriented such that when the cover plate is moved to the selected one of the closed and open positions, a relatively strong force of attraction is generated between the first and second magnetically attractive units so as to position the cover plate in the selected one of the closed and open positions, and such that once the cover plate is displaced to the transition position, a relatively strong force of repulsion is generated between the first and second magnetically attractive units to facilitate movement of the cover plate away from the transition position.

According to a second aspect of the disclosure, a sliding positioning mechanism for an electronic device is provided. The electronic device includes a base cover with a concealed area, and a cover plate which has a front marginal region and which is slidable relative to the base cover in a longitudinal direction among a closed position, where the front marginal region covers the concealed area, an open position, where the front marginal region exposes the concealed area, and a transition position between the closed and open positions. The slide positioning mechanism includes a base frame mounted on the base cover, a guided frame, and at least one positioning assembly. The guided frame is mounted beneath the cover plate to slide therewith, and is configured to be slidably guided by the base frame so as to permit the cover plate to be guided to slide relative to the base cover. The positioning assembly includes a first magnetically attractive unit and a second magnetically attractive unit. The first magnetically attractive unit is mounted on and outboard of the base frame, and has a plurality of first magnetically attractive members arranged in tandem in the longitudinal direction. The second magnetically attractive unit is mounted beneath the cover plate to slide therewith, and has a plurality of second magnetically attractive members arranged in tandem in the longitudinal direction. The first and second magnetically attractive members respectively have north poles and south poles oriented such that when the cover plate is moved to the selected one of the closed and open positions, a relatively strong force of attraction is generated between the first and second magnetically attractive units so as to position the cover plate in the selected one of the closed and open positions, and such that once the cover plate is displaced to the transition position, a relatively strong force of repulsion is generated between the first and second magnetically attractive units to facilitate movement of the cover plate away from the transition position.

BRIEF DESCRIPTION OF THE DRAWINGS

Other features and advantages of the disclosure will become apparent in the following detailed description of the embodiment(s) with reference to the accompanying drawings, in which.

DETAILED DESCRIPTION

To aid in describing the disclosure, directional terms may be used in the specification and claims to describe portions of the present disclosure (e.g., front, rear, left, right, top, bottom, etc.). These directional definitions are intended to merely assist in describing and claiming the disclosure and are not intended to limit the disclosure in any way.

Figure 1:
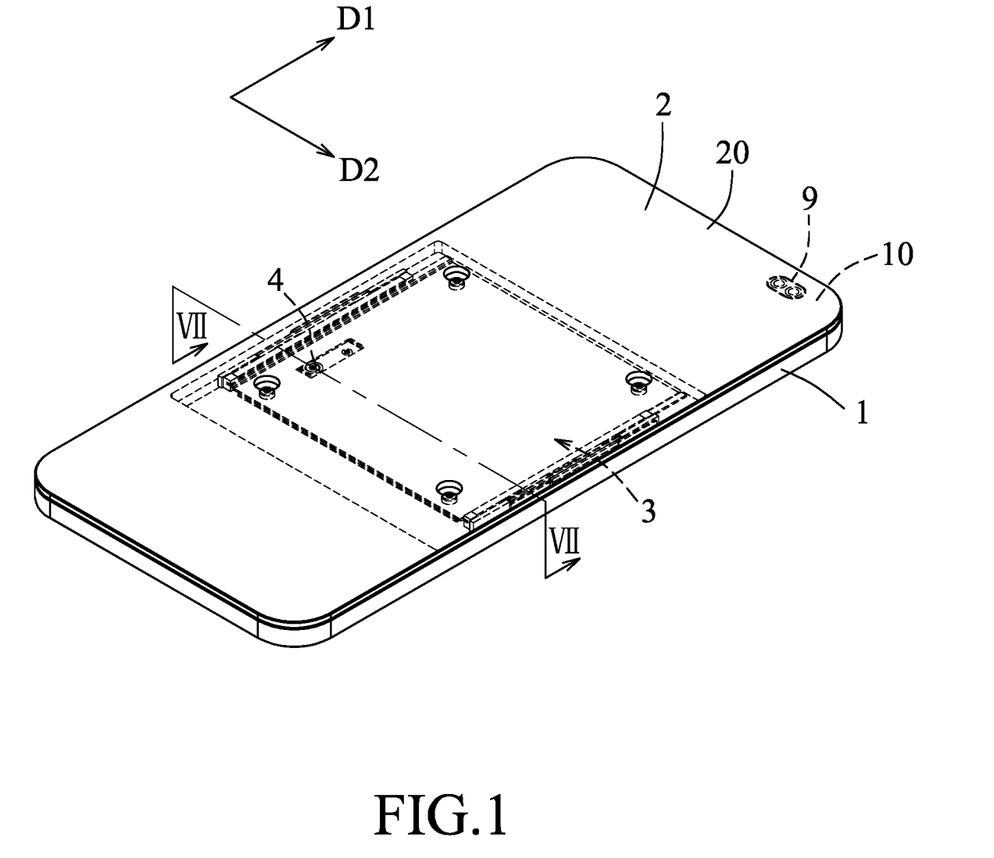
FIG. 1 is a perspective view of an electronic device according to an embodiment of the disclosure, illustrating a cover plate in a closed position, and omitting a display thereof.
Figure 2:
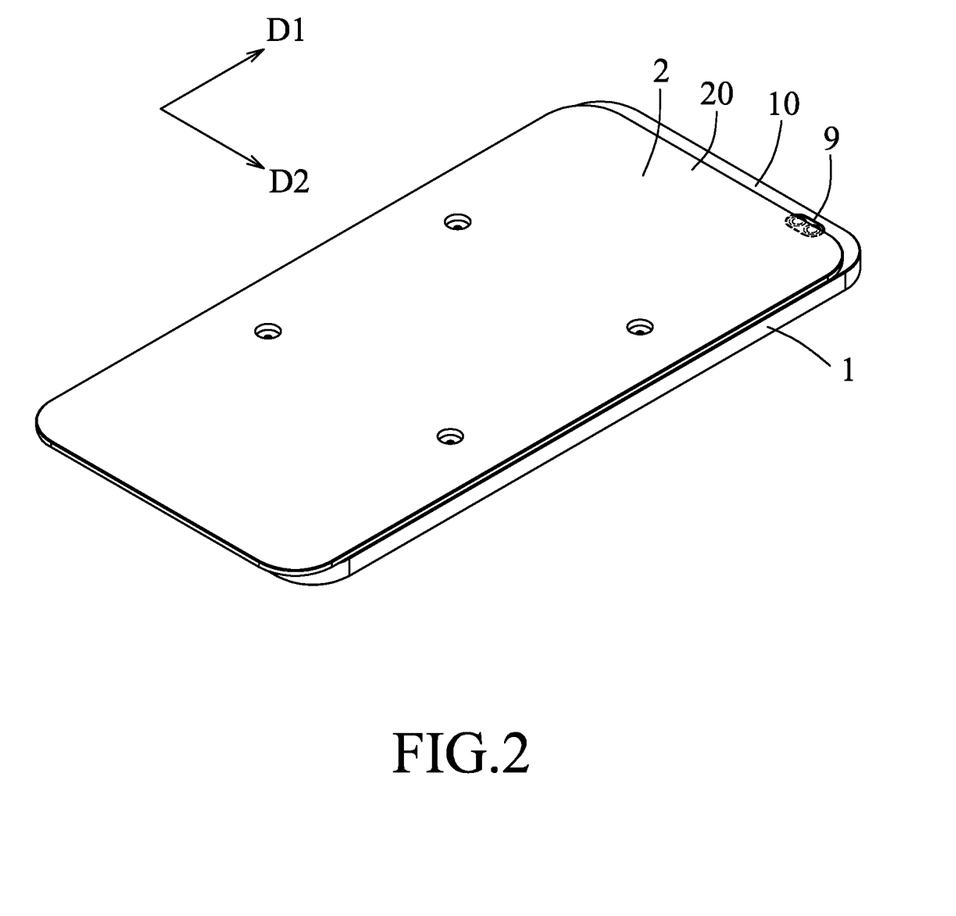
FIG. 2 is similar to FIG. 1, but illustrating the cover plate in a transition position.
Figure 3:
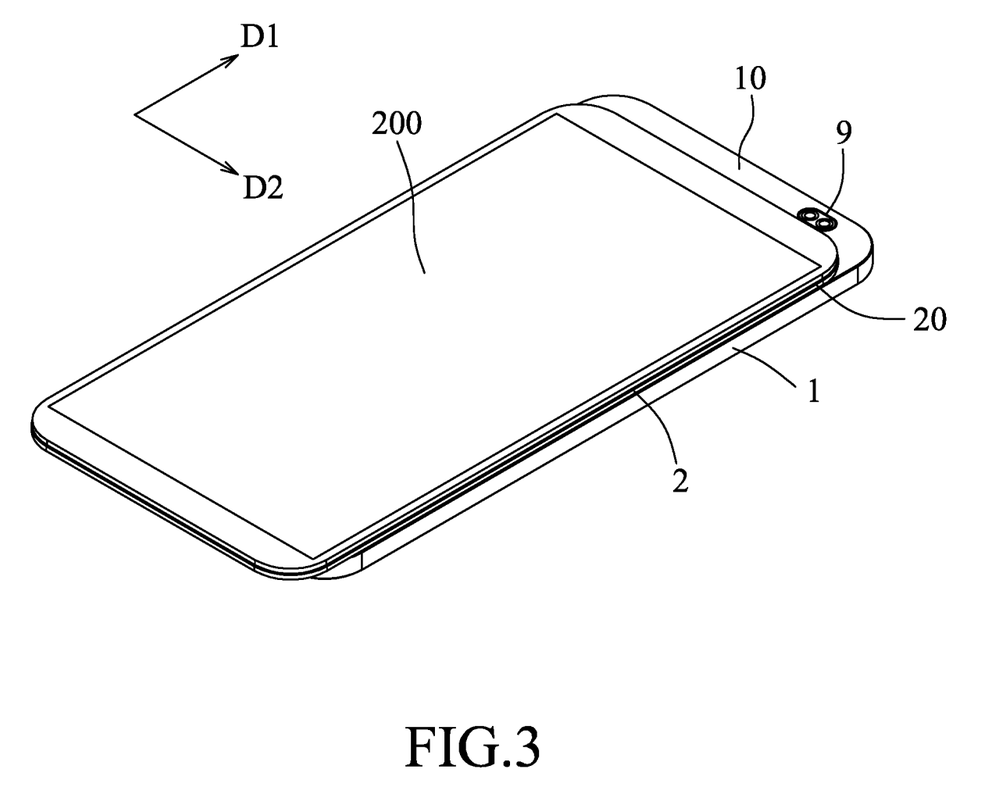
FIG. 3 is similar to FIG. 2, but showing the display and illustrating the cover plate in an open position.

Referring to FIGS. 1 to 3, an electronic device according to an embodiment of the disclosure is shown to include a base cover 1 with a concealed area 10, a cover plate 2, and a slide positioning mechanism 3.

The cover plate 2 has a front marginal region 20 and is slidable relative to the base cover 1 in a longitudinal direction (D1) among a closed position (FIG. 1), where the front marginal region 20 covers the concealed area 10, an open position (FIG. 3), where the front marginal region 20 exposes the concealed area 10, and a transition position (FIG. 2) between the closed and open positions.

Figure 7:
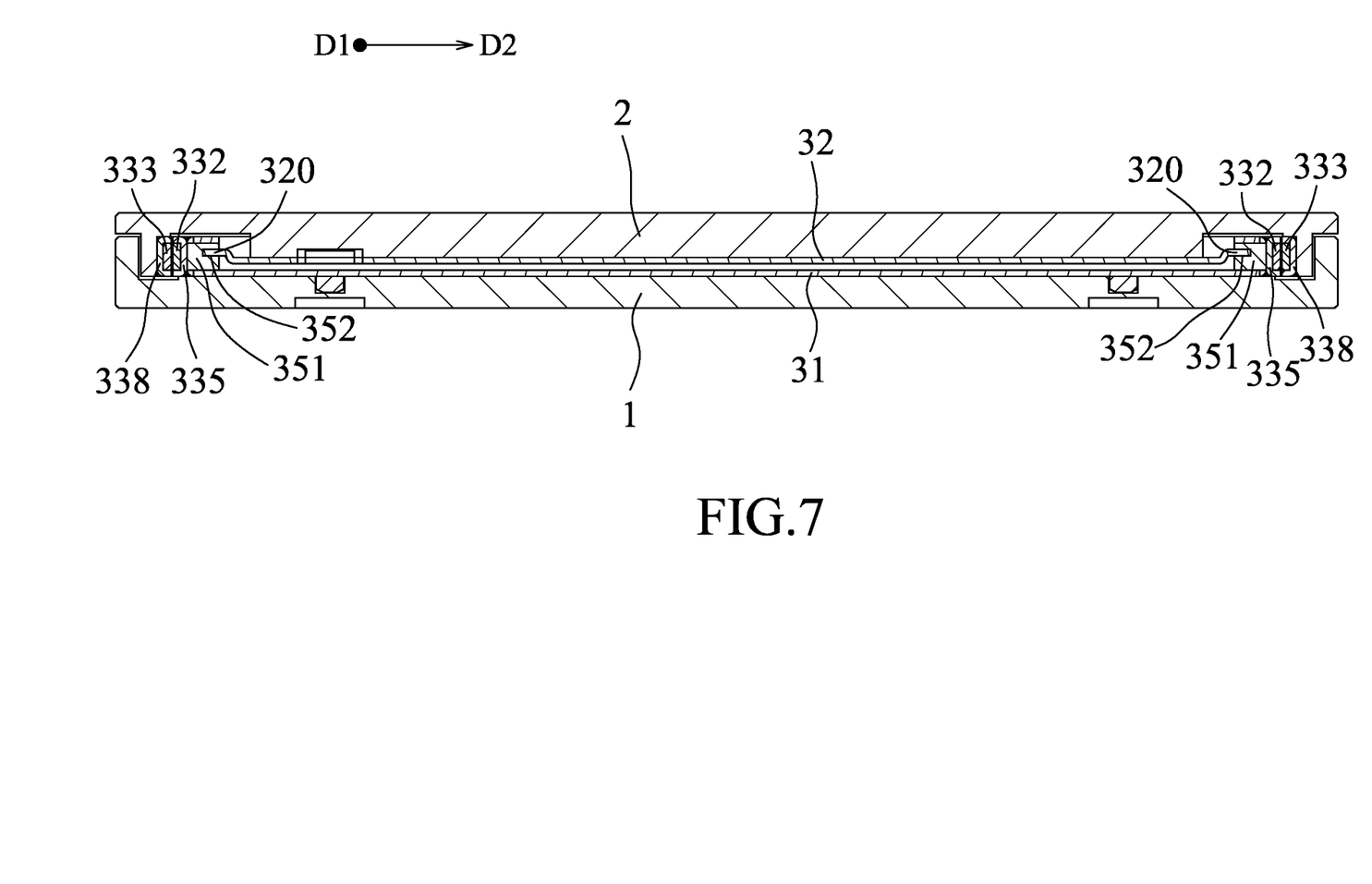
FIG. 7 is a cross-sectional view taken along line VII-VII of FIG. 1.
Figure 8:
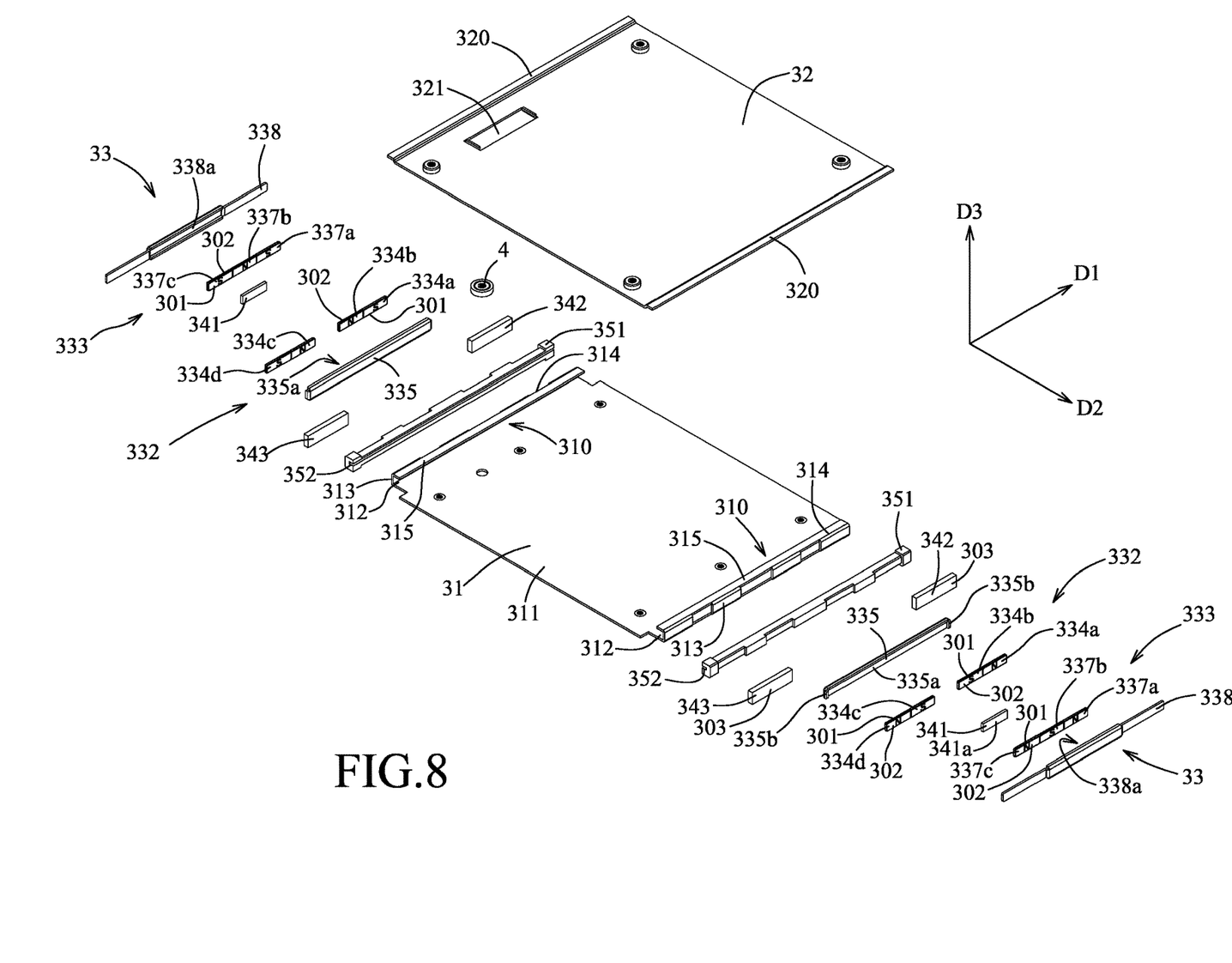
FIG. 8 is an exploded perspective view of the slide positioning mechanism.

The slide positioning mechanism 3 is disposed between the base cover 1 and the cover plate 2 to permit the cover plate 2 to be slidably positioned relative to the base cover 1 in a selected one of the closed and open positions. As shown in FIGS. 7 and 8, the slide positioning mechanism 3 includes a base frame 31, a guided frame 32, and at least one positioning assembly 33 including a first magnetically attractive unit 332 and a second magnetically attractive unit 333.

The base frame 31 is mounted on the base cover 1, and defines two elongated grooves 310 which respectively extend in the longitudinal direction (D1).

In an embodiment shown in FIG. 8, the base frame 31 has a base body 311, a pair of groove bottom walls 313, and a pair of groove lateral walls 315. The base body 311 has two body ends 312 opposite to each other in a transverse direction (D2) relative to the longitudinal direction (D1). Each of the groove bottom walls 313 extends from a respective one of the body ends 312 in a direction (D3) transverse to both the longitudinal direction (D1) and the transverse direction (D2) to terminate at a wall edge 314. The groove lateral walls 315 extend respectively from the wall edges 314 of the groove bottom walls 313 toward each other to form the two elongated grooves 310 in cooperation with base body 311 and the groove bottom walls 313.

The guided frame 32 is mounted beneath the cover plate 2 to slide therewith, and has two guided marginal regions 320 configured to be slidably retained in the elongated grooves 310, respectively, so as to permit the cover plate 2 to be guided to slide relative to the base cover 1. In an alternative not shown embodiment, each of the base frame 31 and the guided frame 32 may be formed integrally with a respective one of the base cover 1 and the cover plate 2.

The first magnetically attractive unit 332 is mounted on and outboard of the base frame 31, and has a plurality of first magnetically attractive members 334a, 334b, 334c, 334d arranged in tandem in the longitudinal direction (D1). The second magnetically attractive unit 333 is mounted beneath the cover plate 2 to slide therewith, and has a plurality of second magnetically attractive members 337a, 337b, 337c arranged in tandem in the longitudinal direction (D1). The first and second magnetically attractive members 334a, 334b, 334c, 334d, 337a, 337b, 337c respectively have north poles and south poles oriented such that when the cover plate 2 is moved to the selected one of the closed and open positions, a relatively strong force of attraction is generated between the first and second magnetically attractive units 332, 333 so as to position the cover plate 2 in the selected one of the closed and open positions, and such that once the cover plate 2 is displaced to the transition position, a relatively strong force of repulsion is generated between the first and second magnetically attractive units 332, 333 to facilitate movement of the cover plate 2 away from the transition position. With the provision of the sliding position mechanism 3, the electronic device may have a relatively small thickness.

In an embodiment shown in FIGS. 7 and 8, the slide positioning mechanism 3 may further include a pair of elongated inserts 351 which are fitted respectively in the elongated grooves 310. Each of the elongated inserts 351 defines a guiding clearance 352 extending in the longitudinal direction (D1) and configured to permit a respective one of the guided marginal regions 320 to be slidably received therein.

In an embodiment shown in FIGS. 5 to 8, the positioning assembly 33 further includes a first mounting seat 335 and a second mounting seat 338. The first mounting seat 335 is disposed on and outboard of one of the groove bottom walls 313, and has a first mounting surface 335a. The second mounting seat 338 is mounted beneath the cover plate 2 to slide therewith, and has a second mounting surface 338a which confronts the first mounting surface 335a. The first and second magnetically attractive units 332, 333 are respectively mounted on the first and second mounting surfaces 335a, 338a to confront each other.

In one embodiment, each of the first and second mounting seats 335, 338 may be made from a magnetic shielding material to shield at least part of a magnetic field from a respective one of the first and second magnetically attractive units 332, 333 so as to permit the magnetic fields from the first and second magnetic attractive units 332, 333 to be directed toward each other. The magnetic shielding material may be any material for shielding a magnetic field, such as a non-magnetic material or magnetic material. In an embodiment, each of the first and second mounting seats 335, 338 may be made from metal. Alternatively, the first mounting seat 335 may be integrally formed with the base frame 31, and the second mounting seat 338 may be integrally formed with the cover plate 2.

Figure 4:
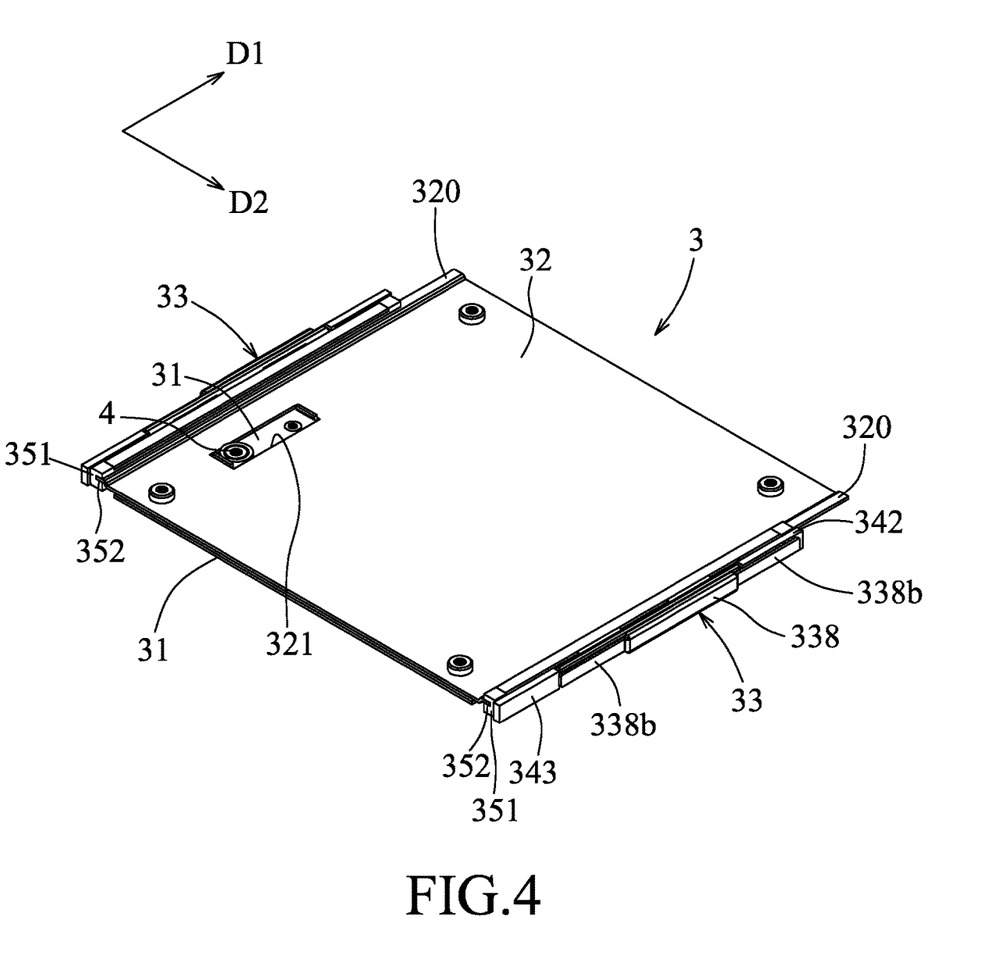
FIG. 4 is a perspective view of a slide positioning mechanism of the electronic device.
Figure 5:
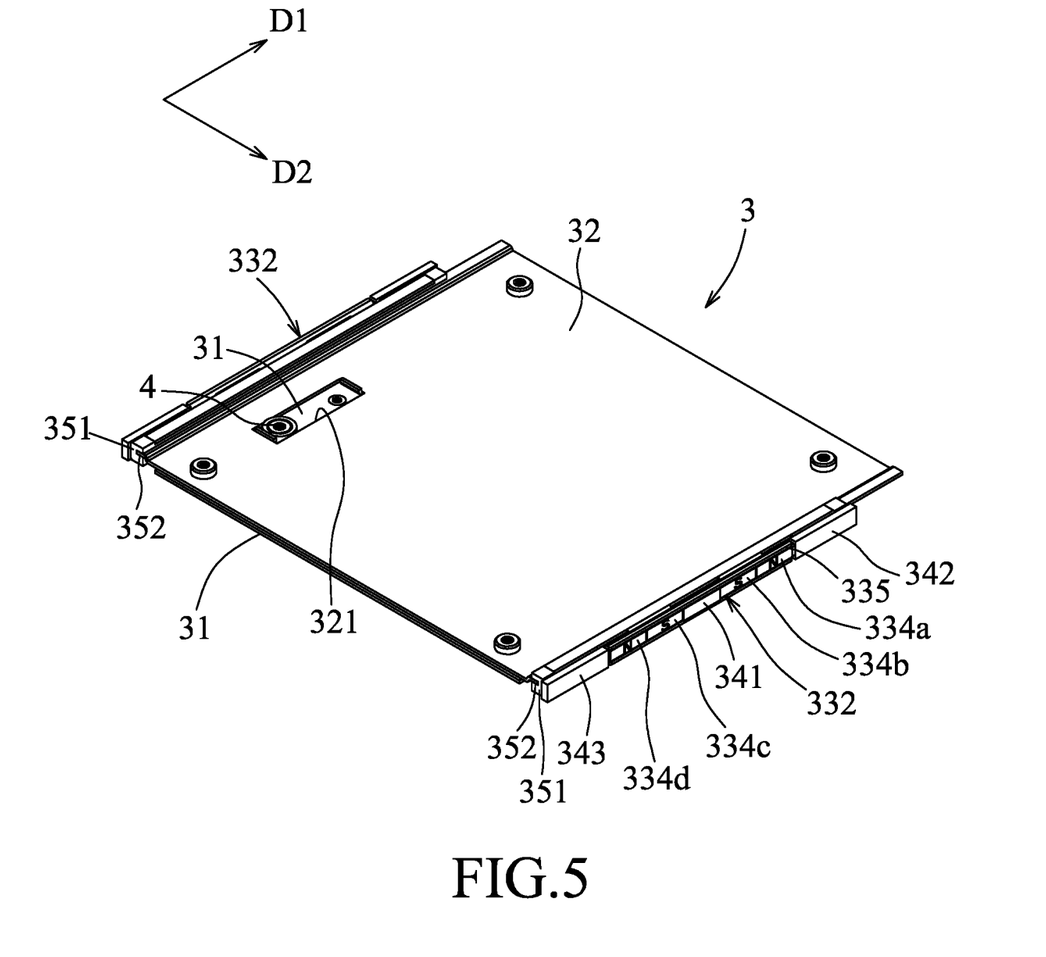
FIG. 5 is similar to FIG. 4, but omitting a pair of second mounting seats and a pair of second magnetically attractive units.

In an embodiment shown in FIGS. 4 and 5, the slide positioning mechanism 3 may further include a key slot 321 and a key 4. The key slot 321 is formed in the guided frame 32. The key 4 is mounted on the base frame 31, and is configured to be inserted into the key slot 321 so as to restrict movement of the guided frame 32, thereby restricting movement of the cover plate 2 between the closed and open positions. Other configuration for restricting the movement of the cover plate 2 may be used.

Figure 9:
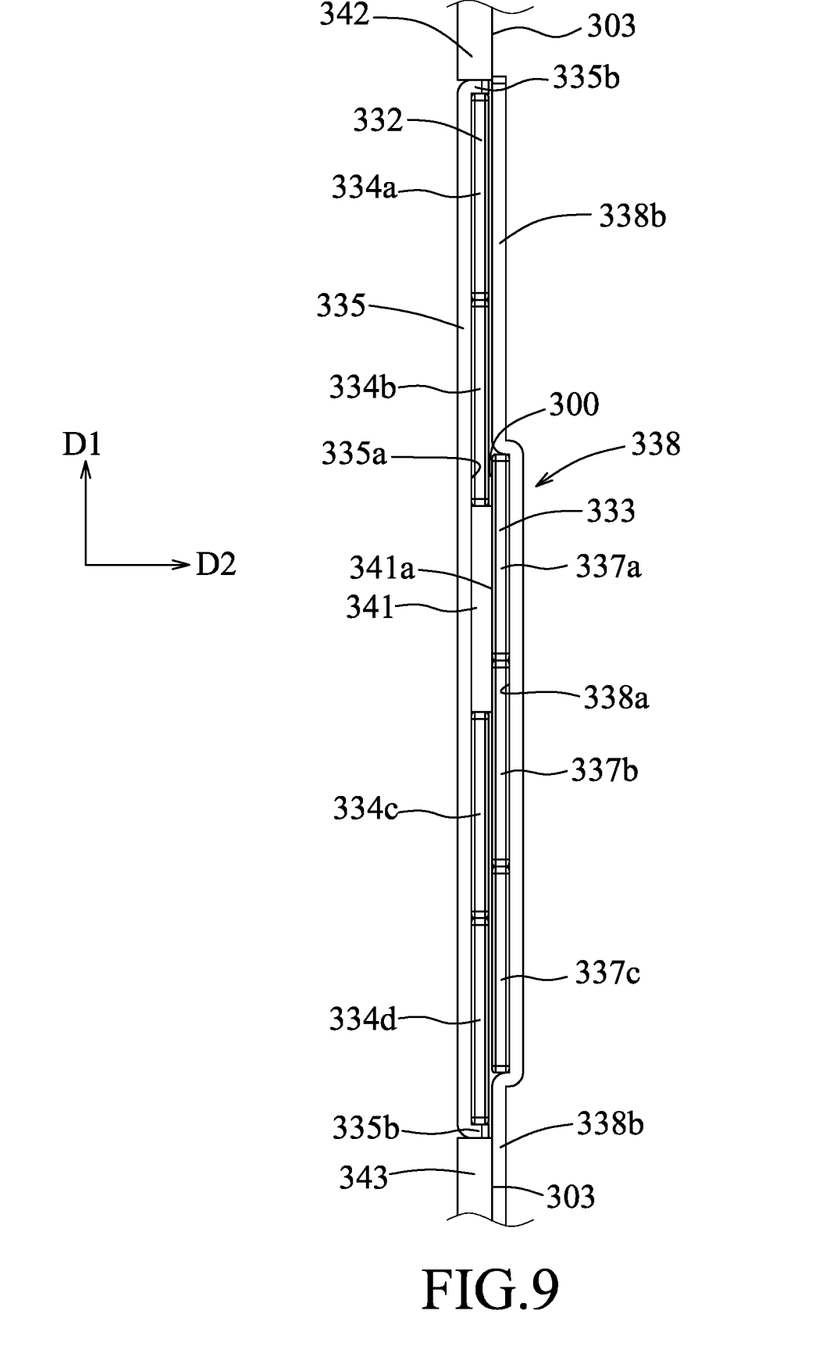
FIG. 9 is a schematic view illustrating first and second magnetically attractive units between first and second mounting seats.

In an embodiment shown in FIGS. 8 and 9, the first magnetically attractive unit 332 may have a front pair of the first magnetically attractive members 334a, 334b, and a rear pair of the first magnetically attractive members 334c, 334d, which are spaced apart from the front pair by a spacer 341. The second magnetically attractive unit 333 has three of the second magnetically attractive members 337a, 337b, 337c. Each of the first and second magnetically attractive members 334a, 334b, 334c, 334d, 337a, 337b, 337c has an inner surface 301 with one of the north and south poles, and an outer surface 302 with the other one of the north and south poles.

Figure 10:
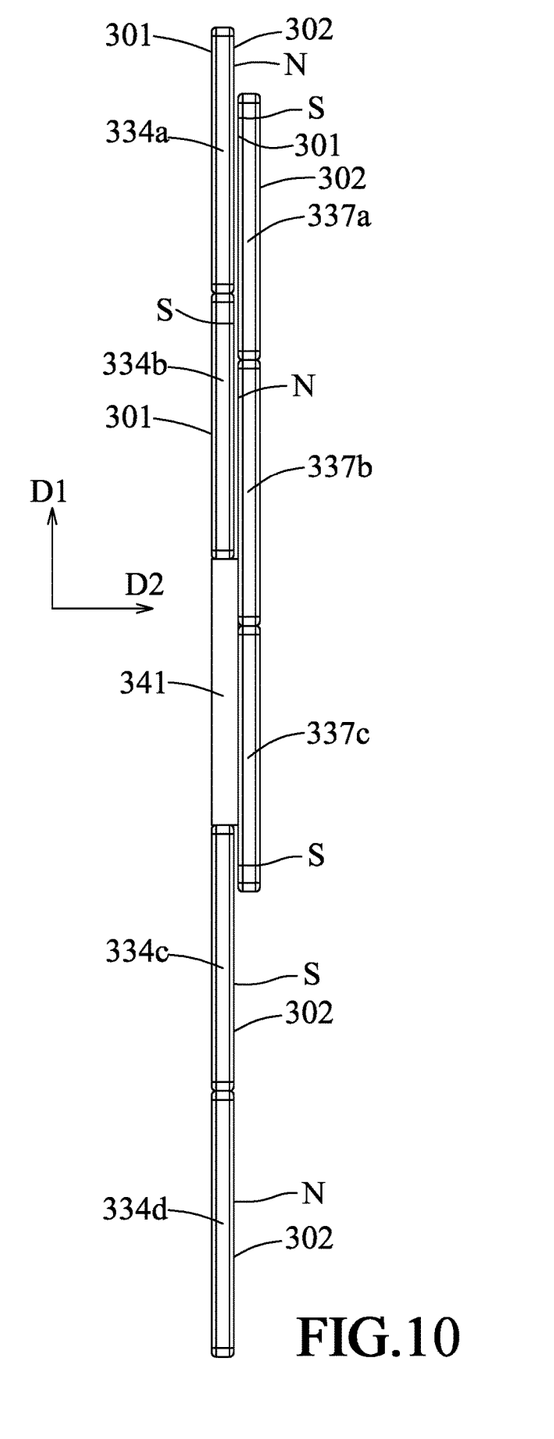
FIG. 10 is a schematic view illustrating a relative position between the first and second magnetically attractive units when in the closed position.

As shown in FIG. 10, the outer surfaces 302 of the front pair of the first magnetically attractive members 334a, 334b are of opposite poles to those of the inner surfaces 301 of two front ones of the second magnetically attractive members 337a, 337b, respectively.

Figure 11:
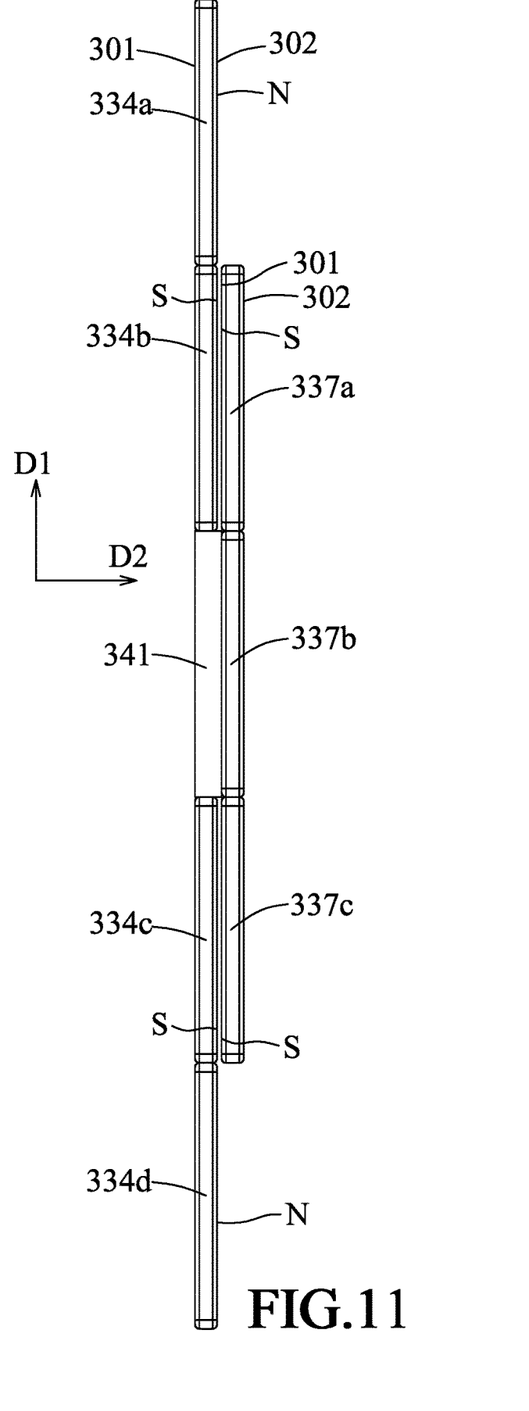
FIG. 11 is similar to FIG. 10 but illustrating the transition position.

As shown in FIG. 11, the outer surface 302 of a rear one of the front pair of the first magnetically attractive members 334b and the outer surface 302 of a front one of the rear pair of the first magnetically attractive members 334c are of the same poles to those of the inner surfaces 301 of a frontmost one and a rearmost one of the second magnetically attractive members 337a, 337c, respectively.

Figure 12:
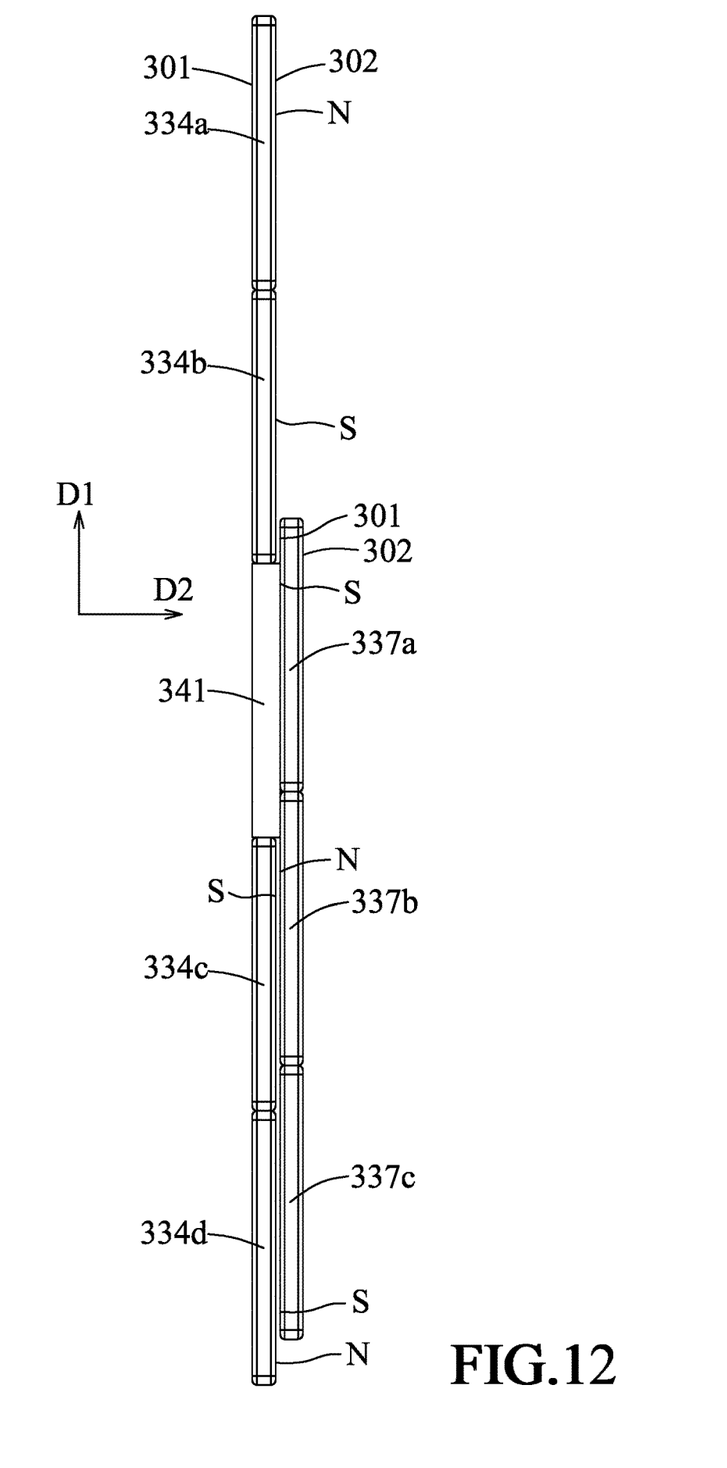
FIG. 12 is similar to FIG. 10 but illustrating the open position.

As shown in FIG. 12, the outer surfaces 302 of the rear pair of the first magnetically attractive members 334c, 334d are of opposite poles to those of the inner surfaces 301 of two rear ones of the second magnetically attractive members 337b, 337c, respectively.

In an embodiment shown in FIGS. 10 to 12, each of the first and second magnetically attractive members 334a, 334b, 334c, 334d, 337a, 337b, 337c is a magnet with the north (N) and south (S) poles. The outer surfaces 302 of the first magnetically attractive members 334a, 334b, 334c, 334d are of N, S, S, and N poles, respectively. The inner surfaces 301 of the second magnetically attractive members 337a, 337b, 337c are of S, N, and S poles, respectively. In an alternative not shown embodiment, the spacer 341 may be replaced by an additional first magnetically attractive member with an outer surface of N pole.

In an embodiment shown in FIGS. 8 and 9, the first mounting seat 335 has two abutted ends 335b opposite to each other in the longitudinal direction (D1), and the second mounting seat 338 has two end extensions 338b opposite to each other in the longitudinal direction (D1). The positioning assembly 33 may further include a pair of stop members 342, 343 disposed on the one of the groove bottom walls 313 to be respectively in abutting engagement with the two abutted ends 335b. Each of the stop members 342, 343 has a guiding surface 303 which is configured to permit a respective one of the end extensions 338b to be slidable thereon in the longitudinal direction (D1). Each of the stop members 342, 343 defines a thickness in the transverse direction (D2) so as to keep a spacing clearance 300 between the first and second magnetically attractive units 332, 333. With the provision of the spacing clearance 300, the first and second magnetically attractive units 332, 333 are prevented from contacting each other. Thus, an undue strong force of attraction between the first and second magnetically attractive units 332, 333 could be prevented, and the cover plate 2 is permitted to be smoothly and easily switched between the closed and open positions.

In an embodiment shown in FIGS. 9 to 12, the spacer 341 and the first and second magnetically attractive members 334a, 334b, 334c, 334d, 337a, 337b, 337c may have substantially the same length in the longitudinal direction (D1), and the spacer 341 has a guiding surface 341a configured to permit the second magnetically attractive unit 333 to be slidable thereon.

In an embodiment shown in FIGS. 10 to 12, when the cover plate 2 is in the closed position (FIG. 10), each of the front pair of the first magnetically attractive members 334a, 334b has a relatively large degree of overlap with a respective one of the two front ones of the second magnetically attractive members 337a, 337b so as to generate the relatively strong force of attraction in the closed position. In detail, an overlapping area between the first and second magnetically attractive members 334a, 337a that attract each other is much greater than that between the first and second magnetically attractive members 334c, 337c that repel each other. In addition, an overlapping area between the first and second magnetically attractive members 334b, 337b that attract each other is much greater than that between the first and second magnetically attractive members 334b, 337a that repel each other.

When the cover plate 2 is in the transition position (FIG. 11), the rear one of the front pair of the first magnetically attractive members 334b and the front one of the rear pair of the first magnetically attractive members 334c overlap fully with the frontmost and rearmost ones of the second magnetically attractive members 337a, 337c, respectively, so as to generate the relatively strong force of repulsion in the transition position.

When the cover plate 2 is in the open position (FIG. 12), each of the rear pair of the first magnetically attractive members 334c, 334d has a relatively large degree of overlap with a respective one of the two rear ones of the second magnetically attractive members 337b, 337c, respectively, so as to generate the relatively strong force of attraction in the open position. In details, an overlapping area between the first and second magnetically attractive members 334c, 337b that attract each other is much greater than that between the first and second magnetically attractive members 334b, 337a that repel each other. In addition, an overlapping area between the first and second magnetically attractive members 334d, 337c that attract each other is much greater than that between the first and second magnetically attractive members 334c, 337c that repel each other.

With the above arrangement, the cover plate 2 may be easily switchable by a manually force.

In an embodiment shown in FIGS. 1 to 3, the electronic device may be a portable communication device with a camera lens 9 disposed in the concealed area 10.

In an embodiment shown in FIG. 3, the electronic device may further include a display 200 which is mounted on the cover plate 2, and which may have touch screen capabilities. In addition, a circuit board (not shown), a battery (not shown), electronic components (not shown), etc. may be disposed inside the base cover 1.

In an embodiment shown in FIGS. 4, 5, and 8, the slide positioning mechanism 3 includes two of the positioning assemblies 33 at two opposite sides of the base frame 31.

Figure 6:
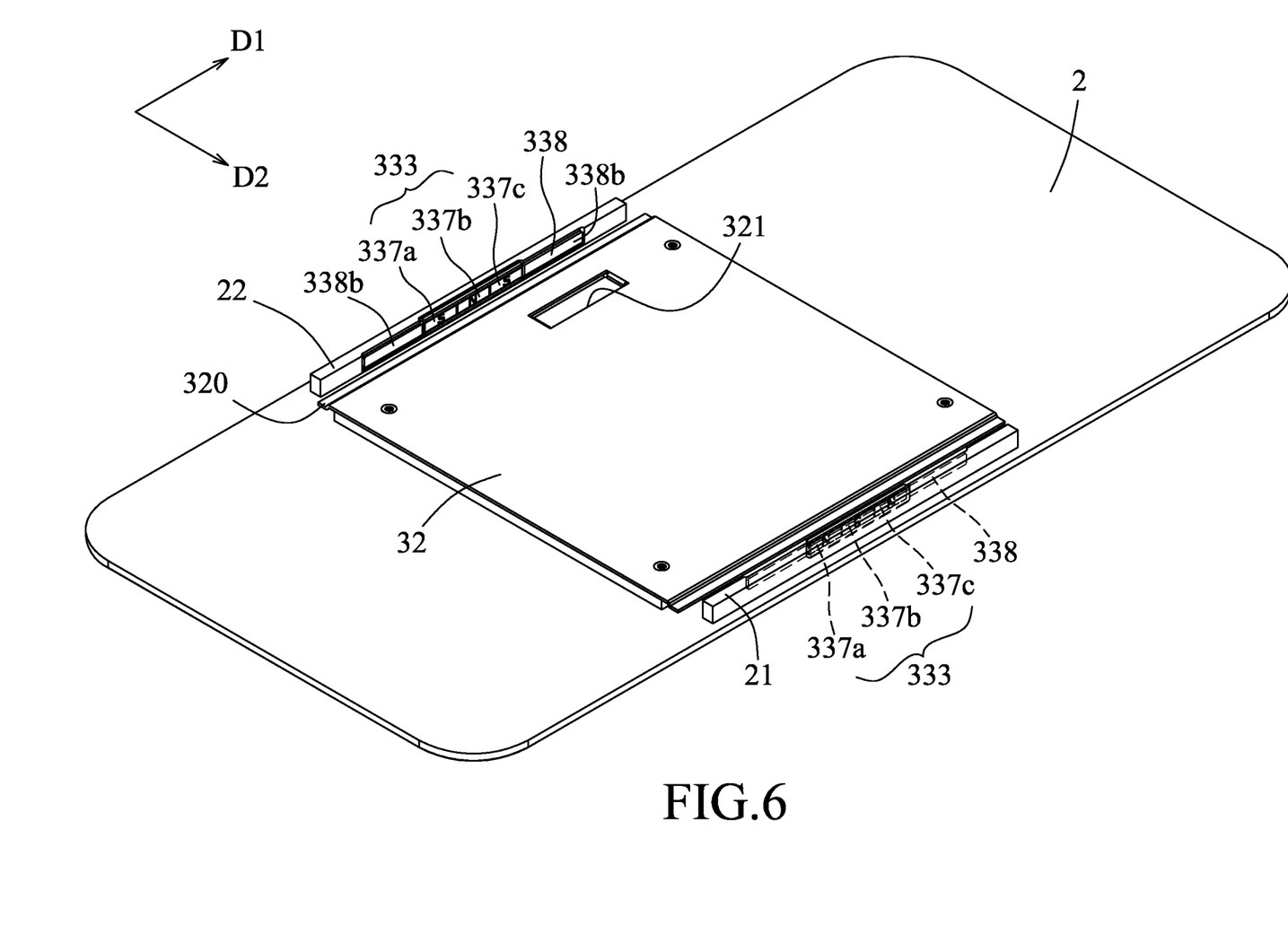
FIG. 6 is a perspective view showing a lower surface of the cover plate.

As shown in FIG. 6, a lower surface of the cover plate 2 may be formed with two elongated ribs 21, 22 which are spaced apart from each other in the transverse direction (D2), and which are configured to permit the second mounting seats 338 of the positioning assemblies 3 to be respectively mounted thereto.

In the description above, for the purposes of explanation, numerous specific details have been set forth in order to provide a thorough understanding of the embodiment(s). It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what is (are) considered the exemplary embodiment(s), it is understood that this disclosure is not limited to the disclosed embodiment(s) but is intended to cover various arrangements included within the spirit and scope of the broadest interpretation so as to encompass all such modifications and equivalent arrangements.

What is claimed is:

1. An electronic device comprising:
    a base cover with a concealed area;
    a cover plate which has a front marginal region and which is slidable relative to said base cover in a longitudinal direction among a closed position, where said front marginal region covers said concealed area, an open position, where said front marginal region exposes said concealed area, and a transition position between the closed and open positions; and
    a slide positioning mechanism disposed between said base cover and said cover plate to permit said cover plate to be slidably positioned relative to said base cover in a selected one of the closed and open positions, said slide positioning mechanism including
    a base frame mounted on said base cover,
    a guided frame mounted beneath said cover plate to slide therewith, and configured to be slidably guided by said base frame so as to permit said cover plate to be guided to slide relative to said base cover, and
    at least one positioning assembly including a first magnetically attractive unit and a second magnetically attractive unit, said first magnetically attractive unit being mounted on and outboard of said base frame, and having a plurality of first magnetically attractive members arranged in tandem in the longitudinal direction, said second magnetically attractive unit being mounted beneath said cover plate to slide therewith, and having a plurality of second magnetically attractive members arranged in tandem in the longitudinal direction, said first and second magnetically attractive members respectively having north poles and south poles oriented such that when said cover plate is moved to the selected one of the closed and open positions, a relatively strong force of attraction is generated between said first and second magnetically attractive units so as to position said cover plate in the selected one of the closed and open positions, and such that once said cover plate is displaced to the transition position, a relatively strong force of repulsion is generated between said first and second magnetically attractive units to facilitate movement of said cover plate away from the transition position,
    wherein
    said base frame has
    a base body with two body ends opposite to each other in a transverse direction relative to the longitudinal direction,
    a pair of groove bottom walls each extending from a respective one of said body ends in a direction transverse to both the longitudinal direction and the transverse direction to terminate at a wall edge, and
    a pair of groove lateral walls extending respectively from said wall edges of said groove bottom walls toward each other to form, in cooperation with said base body and said groove bottom walls, two elongated grooves which respectively extend in the longitudinal direction;
    said guided frame has two guided marginal regions configured to be slidably retained in said elongated grooves, respectively, so as to permit said cover plate to be guided to slide relative to said base cover;
    said positioning assembly further includes
    a first mounting seat disposed on and outboard of one of said groove bottom walls, and having a first mounting surface, and
    a second mounting seat mounted beneath said cover plate to slide therewith, and having a second mounting surface which confronts said first mounting surface, and
    said first and second magnetically attractive units are respectively mounted on said first and second mounting surfaces to confront each other.

2. The electronic device according to claim 1, wherein said slide positioning mechanism further includes a pair of elongated inserts which are fitted respectively in said elongated grooves, each of said elongated inserts defining a guiding clearance which extends in the longitudinal direction and which is configured to permit a respective one of said guided marginal regions to be slidably received therein.

3. The electronic device according to claim 1, wherein each of said first and second mounting seats is made from a magnetic shielding material to shield at least part of a magnetic field from a respective one of said first and second magnetically attractive units so as to permit the magnetic fields from said first and second magnetic attractive units to be directed toward each other.

4. The electronic device according to claim 1, wherein said slide positioning mechanism further includes
    a key slot formed in said guided frame, and
    a key mounted on said base frame, and configured to be inserted into said key slot so as to restrict movement of said guided frame, thereby restricting movement of said cover plate between the closed and open positions.

5. The electronic device according to claim 1, wherein
    said first magnetically attractive unit has a front pair of said first magnetically attractive members, and a rear pair of said first magnetically attractive members, which are spaced apart from said front pair by a spacer;
    said second magnetically attractive unit has three of said second magnetically attractive members;
    each of said first and second magnetically attractive members has an inner surface with one of the north and south poles, and an outer surface with the other one of the north and south poles;
    said outer surfaces of said front pair of said first magnetically attractive members are of opposite poles to those of said inner surfaces of two front ones of said second magnetically attractive members, respectively;
    said outer surface of a rear one of said front pair of said first magnetically attractive members and said outer surface of a front one of said rear pair of said first magnetically attractive members are of the same poles to those of said inner surfaces of a frontmost one and a rearmost one of said second magnetically attractive members, respectively; and said outer surfaces of said rear pair of said first magnetically attractive members are of opposite poles to those of said inner surfaces of two rear ones of said second magnetically attractive members, respectively.

6. The electronic device according to claim 5, wherein said first mounting seat has two abutted ends opposite to each other in the longitudinal direction;
said second mounting seat has two end extensions opposite to each other in the longitudinal direction; and
said positioning assembly further includes a pair of stop members disposed on said one of said groove bottom walls to be respectively in abutting engagement with said two abutted ends, each of said stop members having a guiding surface which is configured to permit a respective one of said end extensions to be slidable thereon in the longitudinal direction, each of said stop members defining a thickness in the transverse direction so as to keep a spacing clearance between said first and second magnetically attractive units.

7. The electronic device according to claim 6, wherein said spacer and said first and second magnetically attractive members have substantially the same length in the longitudinal direction, and said spacer has a guiding surface configured to permit said second magnetically attractive unit to be slidable thereon.

8. The electronic device according to claim 5, wherein
when said cover plate is in the closed position, each of said front pair of said first magnetically attractive members has a relatively large degree of overlap with a respective one of said two front ones of said second magnetically attractive members so as to generate the relatively strong force of attraction in the closed position;
when said cover plate is in the transition position, said rear one of said front pair of said first magnetically attractive members and said front one of said rear pair of said first magnetically attractive members overlap fully with said frontmost and rearmost ones of said second magnetically attractive members, respectively, so as to generate the relatively strong force of repulsion in the transition position; and
when said cover plate is in the open position, each of said rear pair of said first magnetically attractive members has a relatively large degree of overlap with a respective one of said two rear ones of said second magnetically attractive members, respectively, so as to generate the relatively strong force of attraction in the open position.

9. The electronic device according to claim 1, which is a portable communication device with a camera lens disposed in said concealed area.

10. The electronic device according to claim 1, further comprising a display mounted on said cover plate.

11. A slide positioning mechanism for an electronic device which includes a base cover with a concealed area, and a cover plate that has a front marginal region and that is slidable relative to the base cover in a longitudinal direction among a closed position, where the front marginal region covers the concealed area, an open position, where the front marginal region exposes the concealed area, and a transition position between the closed and open positions, said slide positioning mechanism being disposed between the base cover and the cover plate to permit the cover plate to be slidably positioned relative to said base cover in a selected one of the closed and open positions, slide positioning mechanism comprising:
a base frame mounted on the base cover;
a guided frame mounted beneath the cover plate to slide therewith, and configured to be slidably guided by said base frame so as to permit the cover plate to be guided to slide relative to the base cover; and
at least one positioning assembly including a first magnetically attractive unit and a second magnetically attractive unit, said first magnetically attractive unit being mounted on and outboard of said base frame, and having a plurality of first magnetically attractive members arranged in tandem in the longitudinal direction, said second magnetically attractive unit being mounted beneath the cover plate to slide therewith, and having a plurality of second magnetically attractive members arranged in tandem in the longitudinal direction, said first and second magnetically attractive members respectively having north poles and south poles oriented such that when the cover plate is moved to the selected one of the closed and open positions, a relatively strong force of attraction is generated between said first and second magnetically attractive units so as to position the cover plate in the selected one of the closed and open positions, and such that once the cover plate is displaced to the transition position, a relatively strong force of repulsion is generated between said first and second magnetically attractive units to facilitate movement of the cover plate away from the transition position,
wherein
said base frame has
a base body with two body ends opposite to each other in a transverse direction relative to the longitudinal direction,
a pair of groove bottom walls each extending from a respective one of said body ends in a direction transverse to both the longitudinal direction and the transverse direction to terminate at a wall edge, and
a pair of groove lateral walls extending respectively from said wall edges of said groove bottom walls toward each other to form, in cooperation with said base body and said groove bottom walls, two elongated grooves which respectively extend in the longitudinal direction;
said guided frame has two guided marginal regions configured to be slidably retained in said elongated grooves, respectively, so as to permit said cover plate to be guided to slide relative to said base cover;
said positioning assembly further includes
a first mounting seat disposed on and outboard of one of said groove bottom walls, and having a first mounting surface, and
a second mounting seat mounted beneath said cover plate to slide therewith, and having a second mounting surface which confronts said first mounting surface, and
said first and second magnetically attractive units are respectively mounted on said first and second mounting surfaces to confront each other.

* * * * *